(12) United States Patent
Chen et al.

(10) Patent No.: US 11,379,393 B2
(45) Date of Patent: Jul. 5, 2022

(54) MULTI-FREQUENCY MEMORY INTERFACE AND METHODS FOR CONFIGURATING THE SAME

(71) Applicant: INNOGRIT TECHNOLOGIES CO., LTD., Shanghai (CN)

(72) Inventors: Shawn Chen, San Jose, CA (US); Wei Jiang, San Jose, CA (US); Lin Chen, San Jose, CA (US)

(73) Assignee: INNOGRIT TECHNOLOGIES CO., LTD., Shanghai (CN)

(*) Notice: Subject to any disclaimer, the term of this patent is extended or adjusted under 35 U.S.C. 154(b) by 215 days.

(21) Appl. No.: 16/804,171

(22) Filed: Feb. 28, 2020

(65) Prior Publication Data

US 2021/0271613 A1  Sep. 2, 2021

(51) Int. Cl.
*G06F 13/16* (2006.01)
*G06F 1/08* (2006.01)
*G06F 13/42* (2006.01)

(52) U.S. Cl.
CPC ............ *G06F 13/1689* (2013.01); *G06F 1/08* (2013.01); *G06F 13/1694* (2013.01); *G06F 13/4234* (2013.01); *G11C 2207/22* (2013.01)

(58) Field of Classification Search
CPC .... G06F 13/1689; G06F 1/08; G06F 13/1694; G06F 13/4234; G06F 1/06; G11C 2207/22
USPC ........................................................ 711/154
See application file for complete search history.

(56) References Cited

U.S. PATENT DOCUMENTS

| 8,301,833 | B1 * | 10/2012 | Chen .................... G11C 11/005 |
| | | | 711/104 |
| 2016/0196223 | A1 * | 7/2016 | Lee ...................... G11C 7/1072 |
| | | | 710/308 |
| 2020/0174705 | A1 * | 6/2020 | Qawami ............. G06F 13/1689 |
| 2021/0255961 | A1 * | 8/2021 | Byun .................. G06F 12/0638 |

* cited by examiner

*Primary Examiner* — Fernando Hidalgo
(74) *Attorney, Agent, or Firm* — Metis IP LLC

(57) ABSTRACT

A memory system is disclosed in the present disclosure. The memory system may include at least one first type of memory configured on at least one first rank and to operate at a first frequency, and at least one second type of memory configured on at least one second rank and to operate at a second frequency. The memory system may also include a physical block (PHY) configured to generate a first clock at the first frequency and a second clock at the second frequency.

20 Claims, 7 Drawing Sheets

MULTI-FREQUENCY MEMORY INTERFACE AND METHODS FOR CONFIGURATING THE SAME

TECHNICAL FIELD

The present disclosure generally relates to a memory interface, and in particular, to a multi-rank, multi-protocol memory interface that operates at different frequencies in the same system.

BACKGROUND

Modern computing system memory storages are classified, based on the response time, into a hierarchy, from fastest internal registers, cache, main memory such as Dynamic Random-Access Memory (DRAM), to slow local on-line storage such as hard disk and off-line storage like magnetic tapes. Most of the fast memory storage types are volatile, meaning the content of the memory storage cannot be maintained when the power is removed, while the slow storage types are non-volatile, meaning that the content of the memory storage can be maintained even after the power is removed.

The classification is relatively coarse and there are many new types of memory media currently available or under development, for example Phase Change Memory (PCM), Magnetic Random-Access Memory (MRAM), Resistive Random-Access Memory (ReRAM). Most of them are used as a relatively fast memory type but non-volatile in nature. To leverage the existing development effort, many of the new memories share a compatible interface protocol with existing main stream memories such as DRAM. Instead of replacing existing main stream memory storage, the new memory types are generally different in terms of the latency, density and cost, filling the gaps in between the memory hierarchy and used as compliment of the existing storage media. New computing systems are exploring the benefits of different types of the memory media and use a hybrid approach to support multiple type of memories with the same system-on-chip (SoC) product.

Even though the protocols are similar between different type of memories, for example many MRAM products are re-using DRAM protocols, there are technical differences that makes it difficult to have a single interface to support multiple types of memories. For example, many MRAM products are compliant of the DRAM protocol, but can only run at a low speed. Some PCM product is also compliant of DRAM protocol, but since their densities are different from DRAM parts, the addressing scheme, such as the decoding of the address bus is different. There is a need in the art of the improved hybrid memory system architecture design.

Since many different types of memories share the same protocol, it is possible to configure different type of memories into a multi-rank system, where the lower ranks may be used for one type of memory, such as DDR4, and the higher ranks may be used for a different type of memory, such as MRAM or PCM. The benefit of this configuration is that it provides a memory system that has multiple classes of the memory hierarchy and facilitates separating different data and instructions based on the latency and density needs, with reduced silicon die area and cost. Although in the multi-rank system, all ranks generally have the same density, because address pins are shared between different ranks, as well as the interface frequency. Even though such hybrid systems provide the benefits of the different memory classes to the computing system, it is often limited by the difference between different memory types. For example, only compatible addressing schemes can be used, and the interface can only operate at the lowest frequency of the different memory types on different ranks, reducing the potential performance of the faster memory types.

Therefore, it is desired to provide a multi-rank, multi-protocol memory interface that can operate at different frequencies in the same system.

SUMMARY

According to an aspect of the present disclosure, a memory system is provided. The memory system may include at least one first type of memory configured on at least one first rank and to operate at a first frequency, and at least one second type of memory configured on at least one second rank and to operate at a second frequency. The memory system may also include a physical block (PHY) configured to generate a first clock at the first frequency and a second clock at the second frequency.

In some embodiments, the memory system may include a data bus, an address bus, and a command bus. At least one of the data bus, the address bus, or the command bus may be shared between the first type of memory and the second type of memory.

In some embodiments, each of the first type of memory and the second type of memory may be connected to a chip-enable (CE) pin. When the CE pin is selected by a host, the memory connected to the CE pin may be accessible to the host.

In some embodiments, the memory system may also include a first memory controller configured to control the at least one first type of memory, and a second memory controller configured to control the at least one second type of memory. The first memory controller and the second memory controller may operate at a third frequency.

In some embodiments, the memory system may also include a multiplexer (MUX) connected to the first memory controller and the second memory controller, and configured to switch the accessible status of the first type of memory and the second type of memory. When one of the at least one first type of memory is selected by a host, the first memory controller may be accessible to the host through the MUX. When one of the at least one second type of memory is selected by the host, the second memory controller may be accessible to the host through the MUX.

In some embodiments, the PHY may operate at a fourth frequency. The fourth frequency may be a multiple of the third frequency.

In some embodiments, the second frequency may be a fraction of the first frequency.

In some embodiments, the fourth frequency may also be a multiple of at least one of the first frequency or the second frequency.

In some embodiments, the PHY may be configured to divide, based on the fourth frequency, an interface signal of the memory system into a plurality of successive phases.

In some embodiments, the plurality of successive phases may include at least one first phase and at least one second phase. One of the at least one first type of memory may be accessible to a host in the at least one first phase at the first frequency. One of the at least one second type of memory may be accessible to the host in the at least one second phase at the second frequency.

According to an aspect of the present disclosure, a method is provided. The method may include receiving a selection of a memory in a memory system from a host. The memory system may include at least one first type of memory configured to operate at a first frequency, and at least one second type of memory configured to operate at a second frequency. The method may also include determining a type of the selected memory, determining a memory controller corresponding to the type of the selected memory, and establishing a communication between the host and the selected memory via the memory controller.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not drawn to scale. These embodiments are non-limiting exemplary embodiments, in which like reference numerals represent similar structures throughout the several views of the drawings, and wherein.

DETAILED DESCRIPTION

Figure 1:
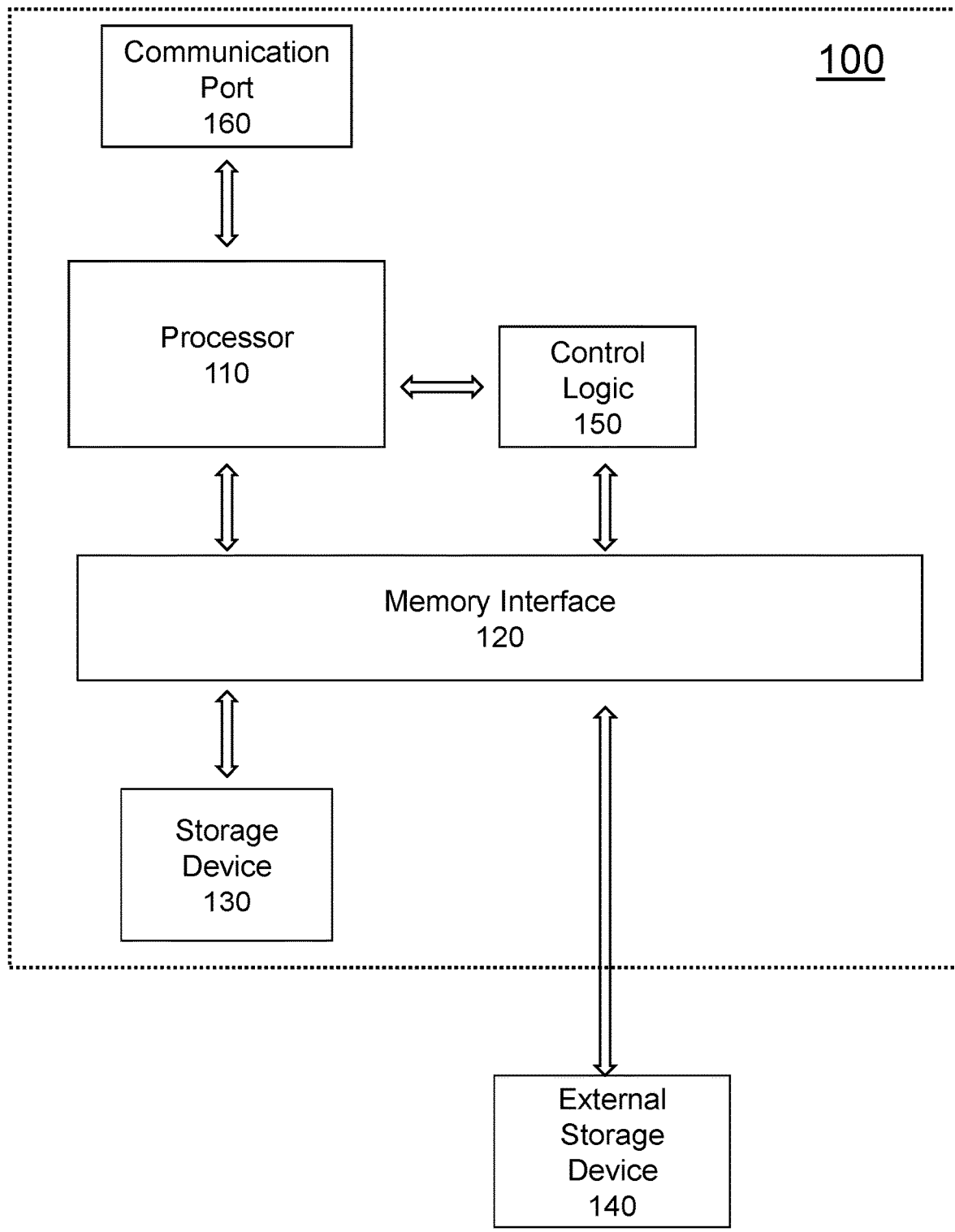
FIG. 1 is a schematic diagram of an exemplary processing system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise.

It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of portions and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

In order to make the purpose, technical solution, and advantages of the present disclosure clearer, the present disclosure will be further described in detail below with reference to the accompanying drawings and embodiments. It should be understood that the specific embodiments described herein are merely illustrative of the present disclosure and are not intended to limit the present disclosure.

This present disclosure relates to memory interface that may operate at different frequencies at the same computer system for different ranks, and enable the faster memory to operate at the full speed while having the benefits of having multiple memory classes to co-exist in the memory interface. A computer system may then separate the data or instructions in different address spaces based on their latency and density needs, to take advantage of the nature of different memory types. The present memory interface includes multiple controller logic blocks on the same product, e.g., a first memory controller logic to control the first type of memories configured on the lower ranks and a second memory controller logic to control the second type of memory configured on the higher ranks. A multiplexer (MUX) may be used between the first memory controller logic and the second memory controller logic to select which memory controller logic to pass through the MUX based on the rank currently being accessed by a host. A generic memory interface physical block (PHY) is designed in such a way that it is flexible to transmit different address and command at different frequencies and support any addressing scheme when a specific rank of memory is accessed by a host. Two or more clocks of different frequencies are generated by the PHY and each of them are sent to the corresponding memories in the system. At any given time, only one of the ranks is active and accessed, and the device on the active rank receives the address, command, clocks and data at its own frequency.

FIG. 1 is a schematic diagram of an exemplary processing system 100 according to some embodiments of the present disclosure. The processing system 100 may include a processor 110, a memory interface 120, a storage device 130, a control logic 150, a communication port 160 and/or any other suitable component for storing or processing data in accordance with various embodiments of the disclosure.

The processor 110 may be configured to process information and/or data. The processor 110 may be a single-core processor or a multi-core processor. Merely by way of example, the processor 110 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a controller, a microcontroller unit, a reduced instruction-set computer (RISC), a microprocessor, or the like, or any combination thereof. In some embodiments, the processor 110 may retrieve data or information from the storage device 130 and/or the external storage device 140. The retrieved data or information may be processed by the processor 110. The processed data or information may be transmitted to any component in the processing system 100 (e.g., the storage device 130, the external storage device 140, the memory interface 120) or any external device outside the processing system 100 through the communication port 160. In some embodiments, the processor 110 may access the storage device 130 and/or the external storage device 140 via the memory interface 120.

The memory interface 120 may be an interface that facilitates a communication between an integrated circuit, such as the processor 110 and a storage device, such as the storage device 130, the external storage device 140. When the memory interface 120 facilitates the communication between the processor 110 and the external storage device 140, the memory interface 120 may also be called an external memory interface. The memory interface 120 may include a multiplexer (MUX), and a plurality of memory controllers. As used herein, a MUX may refer to a multiplexer that selects one of several analog or digital input signals and forwards the selected input into a single line (multiple-input, single-output switch), a demultiplexer that takes a single input signal and forwards the input signal to one of multiple data-output-lines (single-input, multiple-output switch), or a combination of the multiplexer and the demultiplexer (multiple-input, multiple-output switch). The plurality of memory controllers may each be configured to control a type of memories in the storage device 130 or the external storage device 140. The MUX may be configured to allow only one of the plurality of memory controllers to transmit data to or receive data through the MUX. The physical block (PHY) may include one or more data (DATA) pins, one or more address (ADD) pins, one or more reserved pins, one or more command (CMD) pins (or referred to as control (CTL) pins), one or more chip-enable (CE) pins and/or one or more clock (CLK or CK) pins. Two or more clocks of different frequencies may be generated by PHY block and each of them may be sent to the corresponding memories in the storage device 130.

The storage device 130 may be configured to store data or information. The storage device 130 may be accessed by the memory interface 120. The storage device 130 may include a plurality of memories of different types and operating frequencies. The plurality of memories may be classified into at least one type of memories based on their properties. The properties of the memory may include but not limited to operating frequencies, manufacturing processes, volatile or non-volatile, density of memory cells, latency, pin configurations, and operating modes.

Merely by way of example, the storage device 130 may include but not limited to a random-access memory (RAM), a dynamic random-access memory (DRAM), a static random-access memory (SRAM), a non-volatile random-access memory (NVRAM), a resistive random-access memory (ReRAM), a ferroelectric random-access memory (FRAM), a magnetoresistive random-access memory (MRAM), a phase-change memory (PCM), a conductive-bridging random-access memory (CBRAM), a nano-RAM (NRAM), a floating junction gate random-access memory (FJG RAM), a read-only memory (ROM), a mask ROM (MROM), a programmable read-only memory (PROM), an erasable programmable read-only memory (EPROM), an electrically erasable programmable read-only memory (EEPROM), a flash memory, a race track memory, a millipede memory, an optical disk, a magnetic tape, and/or a hard disk. In some embodiments, the type of the memories of the external storage device 140 may be the same as or different from the type of the memories of the storage device 130. For example, the storage device 130 and the external storage device 140 may both be a DRAM. As another example, the storage device 130 may include both DRAM and PCM while the external storage device 140 may only include DRAM.

The control logic 150 may be configured to control the processor 110 and/or the memory interface 120. For example, the control logic 150 may send control signals to the processor 110 and/or the memory interface 120 via a control bus to control the processor 110 and/or the memory interface 120, e.g., to facilitate data or command transmission between them, to synchronize their clocks, to connect or disconnect their pins, etc.

The communication port 160 may be configured to communicate with an external device outside the processing system 100. The communication port 160 include but not limited to a wireless transceiver, a serial port, a universal serial bus (USB) port, an input/output (I/O) port, a digital video interface, a parallel port, an audio port, a video port, a high definition media interface (HDMI) port, etc. In some embodiments, the external storage device 140 may be connected to the memory interface 120 via the communication port 160.

Figure 2:
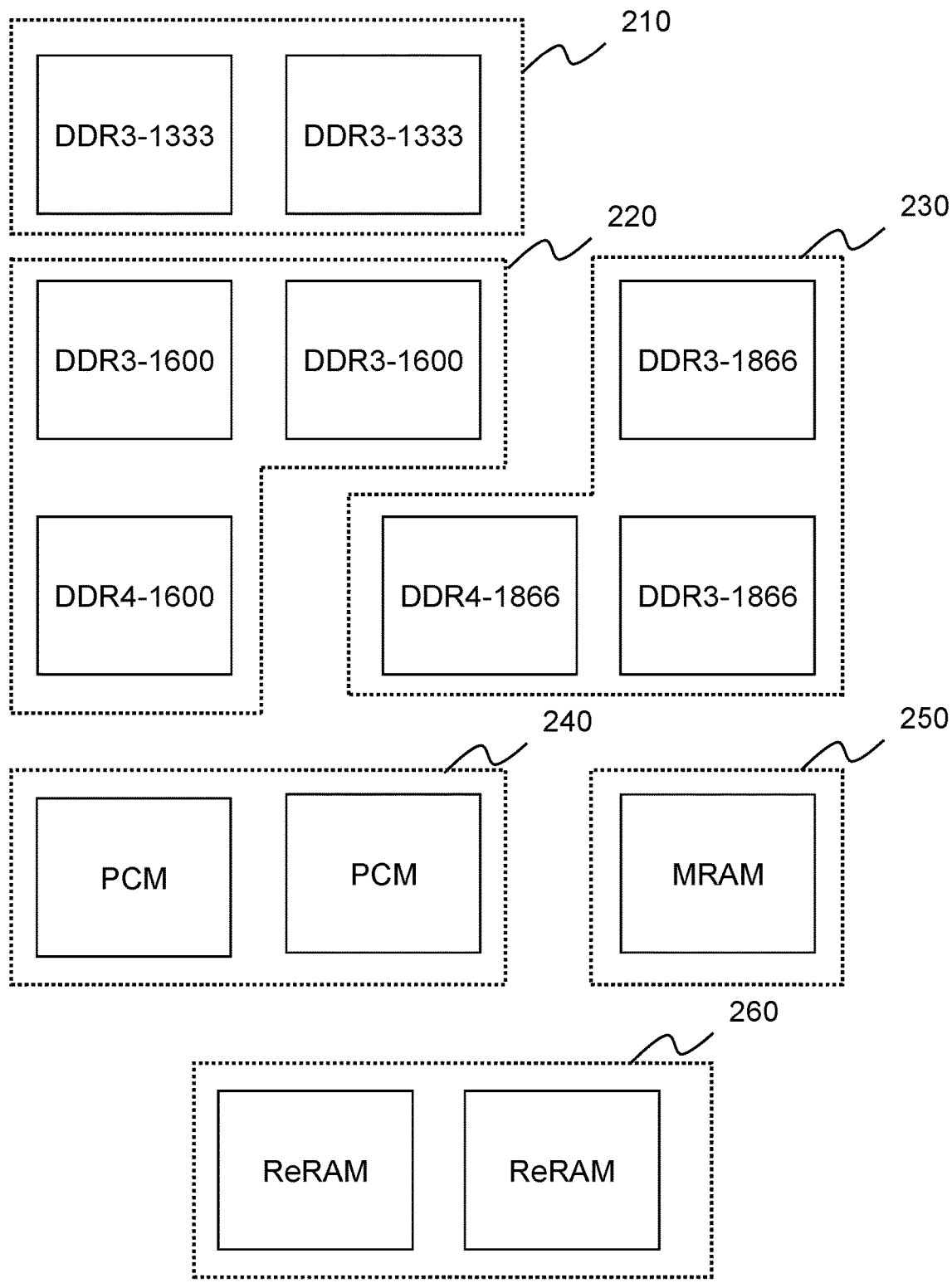
FIG. 2 is a schematic diagram of an exemplary storage device according to some embodiments of the present disclosure.

FIG. 2 is a schematic diagram of an exemplary storage device according to some embodiments of the present disclosure. In some embodiments, the storage device 200 may be an example of the storage device 130 or the external storage device 140. As shown in FIG. 2, the storage device 200 may include a plurality of memories of different types and operating frequencies. The plurality of memories may be classified into the first type to the sixth type 210-260 based on their properties. The properties of the memories may include but not limited to operating frequencies, manufacturing processes, volatile or non-volatile, density of memory cells, latency, pin configurations, and operating modes. For example, two DDR3-1333 SDRAMs may be classified into the first type of memory 210 because of similar properties (both of them may be operating at 666.67 megahertz (MHz)). As another example, two DDR3-1600 SDRAMs and a DDR4 1600 SDRAM may be classified into the second type of memory 220 because of similar properties (All of them may be operating at 800 megahertz (MHz)). It may be noted that the classification in the present disclosure may be slightly different from a normal classification of memory type which cares only about the official names of the memories (e.g., whether the memory is a SDRAM or an EEPROM). For example, the normal classification method may classify the DDR3-1333 and the DDR3-1600 into a same type because they both are called DDR3 SDRAM or DRAM. However, the classification method in the present disclosure may classify them into two different types (e.g., the first type of memory 210 and the second type of memory 220, respectively) because their properties are different (e.g., they operate at different frequencies). As another example, the normal classification method may classify the DDR3-1600 and the DDR4-1600 into different types because their names are different. However, the DDR3-1600 and the DDR4-1600 may have similar properties (e.g., similar operating frequencies) and be classified into the same type of memory (e.g., the second type of memory 220) according to the classification method in the present disclosure. Sometimes, even if two memories are operating at the same frequencies, they may be classified into different types according to the classification method in the present disclosure if their other properties are very different from each other. For example, the PCM may operates at a frequency similar to DDR4-1866, however, the density and latency of the PCM may be very different from those of the DDR4-1866. Thus, the PCM and the DDR4-1866 may be classified into two different types (e.g., the third type 230 and the fourth type 240, respectively). It should be noted that the method of classification of the types of the memories shall not be limiting, the embodiments described elsewhere in the present disclosure, e.g., FIGS. 3-7 may be applied on a memory regardless of how memories thereof are classified or arranged.

Figure 3:
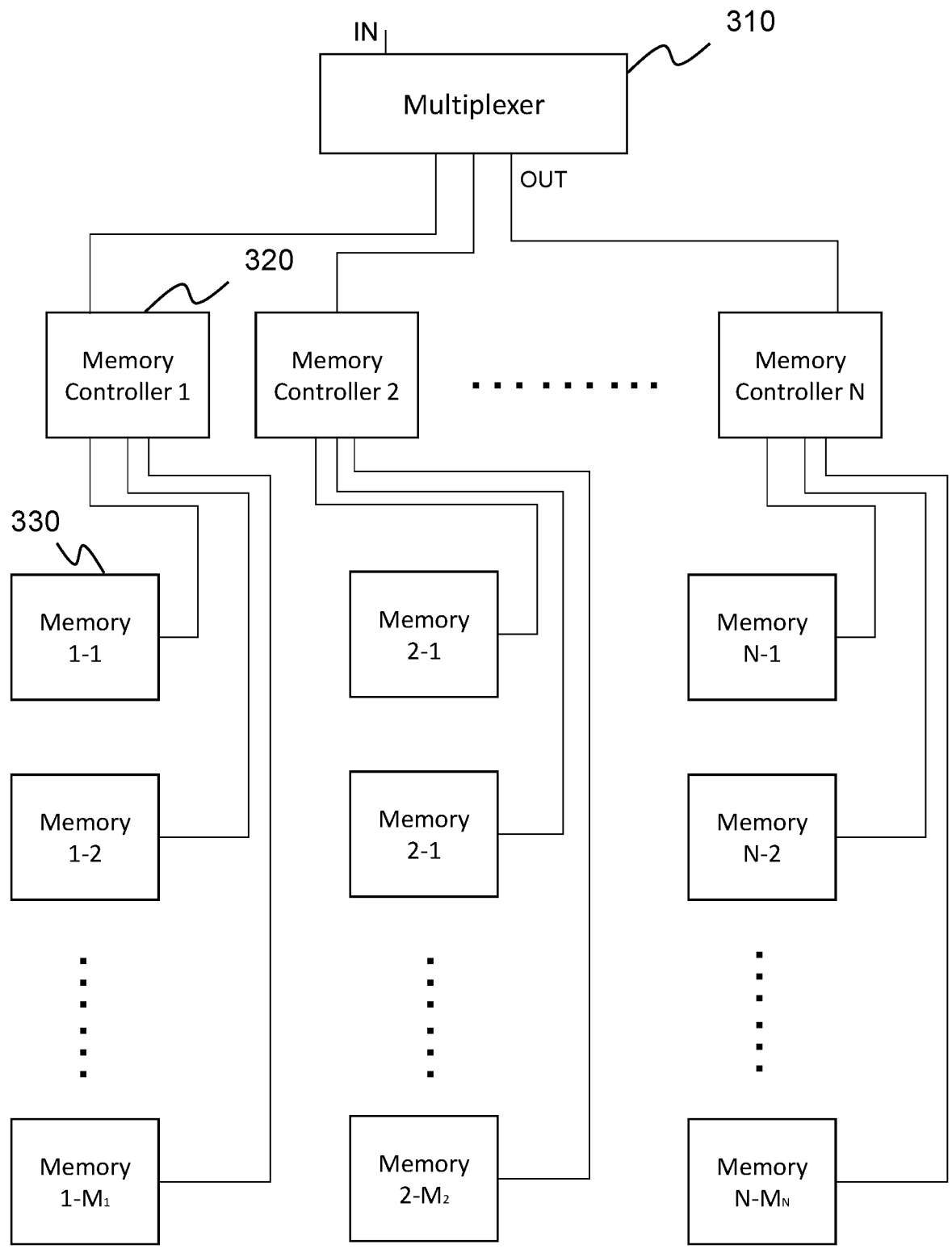
FIG. 3 is a schematic diagram of an exemplary memory interface according to some embodiments of the present disclosure.

FIG. 3 is a schematic diagram of an exemplary memory interface according to some embodiments of the present disclosure. As shown in FIG. 3, the memory interface 300 may include a multiplexer (MUX) and a plurality of memory controllers 320. The memory interface 300 may be an example of the memory interface 120. The plurality of memories 330 may be examples of the memories of the storage device 130 or the external storage device 140. The MUX 310 may include at least one input pin and at least one output pin. As used herein, a MUX may refer to a multiplexer that selects one of several analog or digital input signals and forwards the selected input into a single line (multiple-input, single-output switch), a demultiplexer that takes a single input signal and forwards the input signal to one of multiple data-output-lines (single-input, multiple-output switch), or a combination of the multiplexer and the demultiplexer (multiple-input, multiple-output switch). In some embodiments, the input pin of the MUX 310 may be connected to a physical (PHY) block (e.g., the PHY block 410) of the memory interface 300. The output pins of the MUX 310 may be connected to a plurality of memory controllers 320 (e.g., memory controller 1, memory controller 2, . . . , memory controller N). For example, the MUX 310 may include an individual output pin for each of the plurality of memory controllers 320.

In some embodiments, each of the output pins may correspond to an accessible status of the corresponding memory controller. For example, if the accessible status of a memory controller is set to be 1, the output pin of the memory controller may be at high-voltage. A connection between the input pin of the MUX 310 and the high-voltage output pin of the MUX 310 corresponding to the memory controller may be established. The memory controller may be able to receive or transmit data through the MUX 310. If the accessible status of a memory controller is set to be 0, the output pin of the memory controller may be at low-voltage. The input pin of the MUX 310 may not be connected to the low-voltage output pin of the MUX 310 corresponding to the memory controller.

As another example, at least one of the plurality of memory controller 320 may share one or more output pins. Merely by way of example, N may be eight, each of eight memory controllers 320 may be connected to three output pins of the multiplexer 310. By different configurations of the three output pins (e.g., different voltage levels), different memory controller 320 may be selected by the multiplexer. For example, a 0-0-1 may correspond to a selection of the second memory controller, a 1-1-0 may correspond to a selection of the seventh memory controller. In this case, the signals generated from the three output pins may be further processed to obtain the original input signal.

The plurality of memory controllers 320 may operate at the same frequency or different frequencies. For example, the plurality of memory controllers 320 may operate at a same frequency (e.g., as a fraction of the operating frequency of a PHY block). As another example, each of the plurality of memory controller 320 may operate at a frequency equal to an operating frequency of the memories it connected to.

In some embodiments, each of the memory controllers 320 may be connected to some of the plurality of memories 330. For example, the memory controller 1 may be connected to $M_1$ memories (e.g., memory 1-1, memory 1-2, . . . , memory 1-$M_1$). As another example, the memory controller N may be connected to $M_N$ memories (e.g., memory N-1, memory N-2, . . . , memory N-$M_N$). The memories that are connected to the same memory controller may be of the same type and operate at the same frequency. For example, the $M_1$ memories may be DRAMs operating all at 600 MHz. Merely by way of example, the operating frequency of the $M_1$ memories connecting to the memory controller 1 may be the highest, the operating frequency of the $M_2$ memories connecting to the memory controller 2 may be lower, the operating frequency of the $M_3$ memories connecting to the memory controller 3 may be further lower, and so on. The operating frequency of the $M_N$ memories connecting to the memory controller N may be the lowest.

In some embodiments, each of the memories 330 may be configured on a rank. Merely by way of example, the $M_1$ memories connecting to the memory controller 1 may be configured on lower ranks (e.g., rank 0, rank 1, rank 2) while the $M_N$ memories connecting to the memory controller N may be configured on higher ranks. In some embodiments, the memory interface 300 may be a 4-rank memory interface. For example, N may be 2, and both $M_1$ and $M_2$ may be 2. In other words, the MUX 310 may be connected to a memory controller 1 and a memory controller 2. The memory controller 1 may be connected to a memory 1-1 and a memory 1-2 that both operate at frequency f. The memory controller 2 may be connected to a memory 2-1 and a memory 2-2 that both operate at frequency less than f (e.g., ½ f). The memory 1-1, memory 1-2, memory 2-1, and memory 2-2 may be configured on rank 0, 1, 2 and 3, respectively. Detailed descriptions regarding a 4-rank memory interface may be found elsewhere in the present disclosure, e.g., FIGS. 5-6 and the descriptions thereof.

In some embodiments, the memory controllers 320 may communicate with only one of connected memories at a time. For example, only one of the memories may be enabled at a time (e.g., via the corresponding chip-enable pin described elsewhere in the present disclosure). The memory controllers may try to establish communications with all the memories connected and only the enabled memory may establish the communication with the memory controller. As another example, the memory controller may try to establish a communication with only one target memory. In this case, regardless of whether other memories are enabled or not, only the target memory may establish a communication with the memory controller.

Figure 4:
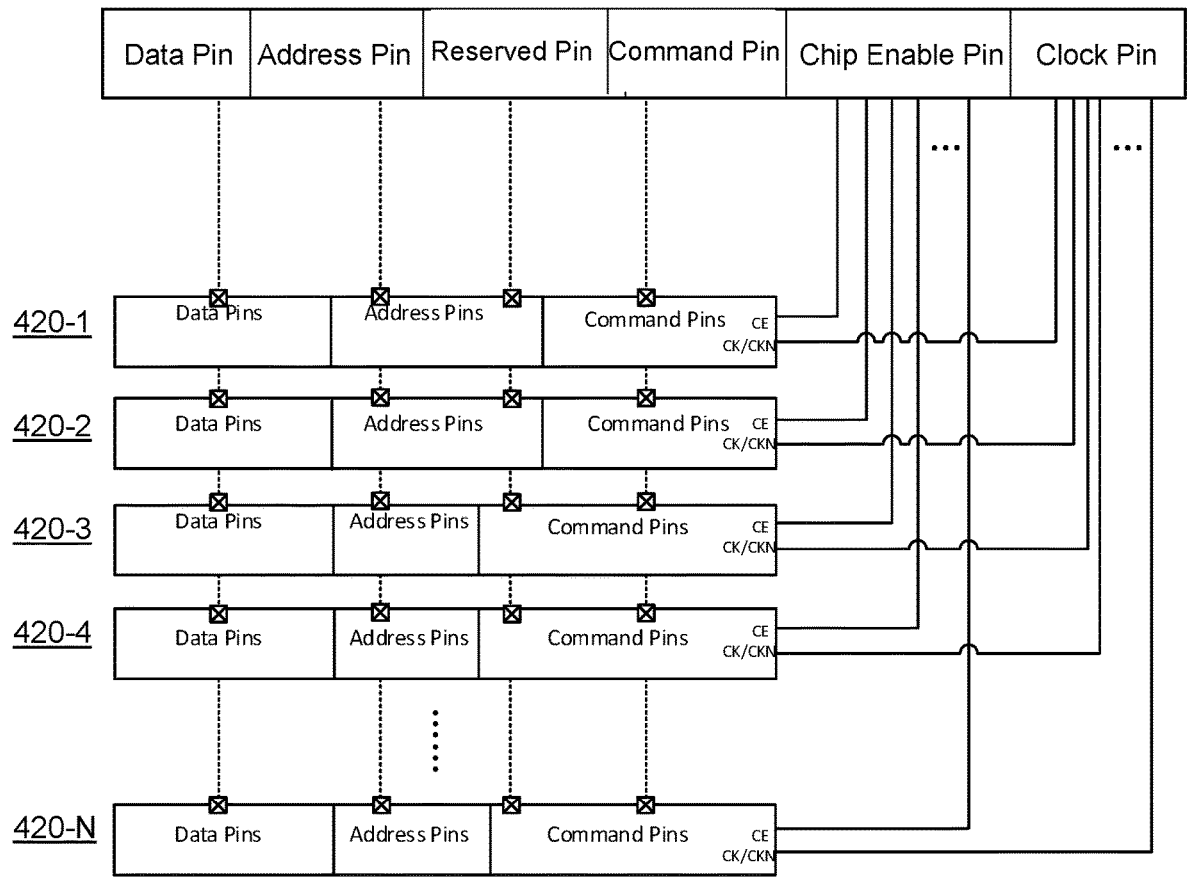
FIG. 4 is a schematic diagram of exemplary pin configurations according to some embodiments of the present disclosure.

FIG. 4 is a schematic diagram of exemplary pin configurations according to some embodiments of the present disclosure. As shown in FIG. 4, a physical (PHY) block 410 of a memory interface (e.g., the memory interface 120, the memory interface 300) may include one or more data (DATA) pins, one or more address (ADD) pins, one or more reserved pins, one or more command (CMD) pins (or referred to as control (CTL) pins), one or more chip-enable (CE) pins and/or one or more clock (CLK or CK) pins.

The DATA pins (or data bus) may include DQS (strobe) pins and DQ (data) pins. The DQS pins may correspond to a time signal used for synchronization and the DQ pins may correspond to data or value. The DQ pins may collectively correspond to a binary number or a value while each of the DATA pins constitutes a digit of the binary number. For example, 8 DQ pins may collectively correspond to a binary number between 00000000 (e.g., 0) and 11111111 (e.g., 255). In some embodiments, the DQS pins may be omitted. The number of DATA pins (or referred to as a width of data bus or bits of data bus) defines the range of the data value and may be any reasonable integers, such as 4, 8, 12, 16, etc.

The ADD pins (or address bus) may be a reference to a memory location in a memory (e.g., the storage device 130, the external storage device 140). For example, data items are usually arranged in ordered and finite sequences of memory locations in the memory. The ADD pins may collectively correspond to a hexadecimal or binary number that correspond to a memory location. The ADD pins may allow the data stored in the memory (especially RAM) to be quickly accessed. In some embodiments, data may be stored in a memory as binary numbers and a memory may store up to one byte of data in a particular memory location. Data greater than one byte may be consecutively segmented into multiple bytes with a series of corresponding addresses. The number of ADD pins (or referred to as a width of address bus or bits of address bus) may be greater than or the equal to the digits of the address of the memory location in the accessed memory. The configurations of the ADD pins may be changed according to the memory that it accesses.

The CMD pins (or command bus) may be used to receive or send commands. The commands may include but not limited to a precharge command, an activate command, a read command, a write command, a burst terminate command, a load mode register command, an auto refresh command, a self refresh command, a no operation command, or the like. By configuring the CMD pins with different voltages (e.g., ones or zeros, high-voltages or low-voltages), a specific command may be generated. The number and configuration of CMD pins may depend on the number and configurations of the CMD pins of the accessed memory.

The reserved pins may be customized pins that may be configured upon request based on the memory that the memory interface is accessing. For example, the reserved pins may be configured with different voltages (e.g., ones or zeros, high-voltages or low-voltages) to send a specific command to a particular memory. As another example, if the address of memory location of a memory that the memory interface is connected to is longer than the number of ADD pins on the PHY block 410 of the memory interface. The reserved pins may work as extra pins for existing ADD pins.

The CE pins may be used to provide power or instructions to the memories 420 to enable the corresponding memories to work. In some embodiments, each of the memories 420 may be connected to an individual CE pin. Alternatively, at least some of the memories 420 may share one or more CE pins. When the CE pin of a memory is set high, the memory may be enabled to work (e.g., in a work state). When the CE pin of a memory is set low, the memory may be in an off state or a sleep state (which costs about 80% less energy than when in the work state). For example, when DATA pins=00010101, ADD pins=1100101010011011, CMD pins=01 (which correspond to a "read" command of the memory interface 410), CE pin 1=1, CE pin X(others)=0, the memory interface may write a value "21" in a memory location "CA9B" of the memory 1 (e.g., memory 420-1).

The CLK pins may be used to generate clock signals to the memories 420. In some embodiments, each type of memory in the memories 420 may operate at a particular frequency. In some embodiments, each of the memories 420 may be connected to an individual CLK pin. A pair of memories 420 of the same type may be connected to a pair of CLK pins that generates clock signals at the same frequency. Alternatively, at least some of the memories 420 may share a CLK pins. For example, a same type of memories that operates at a same frequency may be connected to a same CLK pin. When a particular memory of the memories 420 is selected, the PHY block 410 may change the status of the CLK pin corresponding to the selected memory to oscillate between zero and one (between low-voltage and high-voltage) at a certain oscillating frequency. The oscillating CLK pin may provide a memory clock signal (e.g., a square wave) at an oscillating frequency that may be the same as the operating frequency of the selected memory. In some embodiments, the PHY interface 410 may include an individual clock signal (known as a PHY clock signal). The PHY interface 410 may generate the memory clock signal from the PHY clock signal by a multiplier (e.g., a device that increases the frequency of input signals), a divider (e.g., a device that decreases the frequency of input signals), and/or a synthesizer (e.g., a device that manipulates the frequency of input signals). In some embodiments, the generated memory clock signal may be a phase locked loop (PLL) signal or a non-PLL signal.

As shown in FIG. 4, the CE pins and the CLK pins of the memories 420 (e.g., the memory 420-1, the memory 420-2, the memory 420-3, the memory 420-4, . . . , the memory 420-N) may be directly connected to the CE pins and the CLK pins of the memory interface 410. The DATA pins, the ADD pins, and the CMD pins of the memories 420 may be connected to the corresponding pins of the memory interface via memory controllers (e.g., the memory controllers 320). In other words, the memory controllers may control the communication between DATA pins, the ADD pins and the CMD pins of the memories 420 and those of the memory interface 410. In some embodiments, all of the DATA pins, ADD pins, CMD pins, CE pins, CLK pins of the memories 420 may be connected to the corresponding pins on the memory interface 410 via the memory controllers. Alternatively, all of the DATA pins, ADD pins, CMD pins, CE pins, CLK pins of the memories 420 may be directly connected to the corresponding pins on the memory interface 410. In some embodiments, pins of some of the memories 420 may be directly connected to the corresponding pins on the memory interface 410 while pins of some other of the memories 420 may be connected to the corresponding pins on the memory interface 410 via the memory controllers.

In some embodiments, the each of the memories 420 may be configured on a rank. For example, the memories 420-1 to 420-N may be configured on rank 0, rank 1, . . . rank N-1, respectively. As mentioned above, the data bus may include the strobe (DOS) and the data (DQ) and is shared between all ranks. The address and command bus are also shared between all ranks. The data bus, the address bus and the command bus may be generic instead of having a fixed purpose. A dedicated CE pin may be connected to each rank. Multiple clock signals may be generated on the host. Either each rank may have its own dedicated clock signal or a type of memory at different ranks are grouped to have a shared clock signal. For example, one pair of the clock may be generated for the ranks that are shared by the same type and speed of the memories.

A flexible PHY 410 may be designed to support multiple interface protocols and the controller logic handles the difference between different ranks. The address and command section of the PHY 410 is generic so that it can be configured as any of the address or command pins at any given memory clock cycle. The PHY 410 may divide the interface signals into separate phases that may support several frequency combinations. The controller and the PHY 410 together may decide what to transmit at each phase of the signal to shape up the interface signals as if it is operating at a particular frequency, as well as a particular addressing scheme from the point of view of the memories 420.

Figure 5:
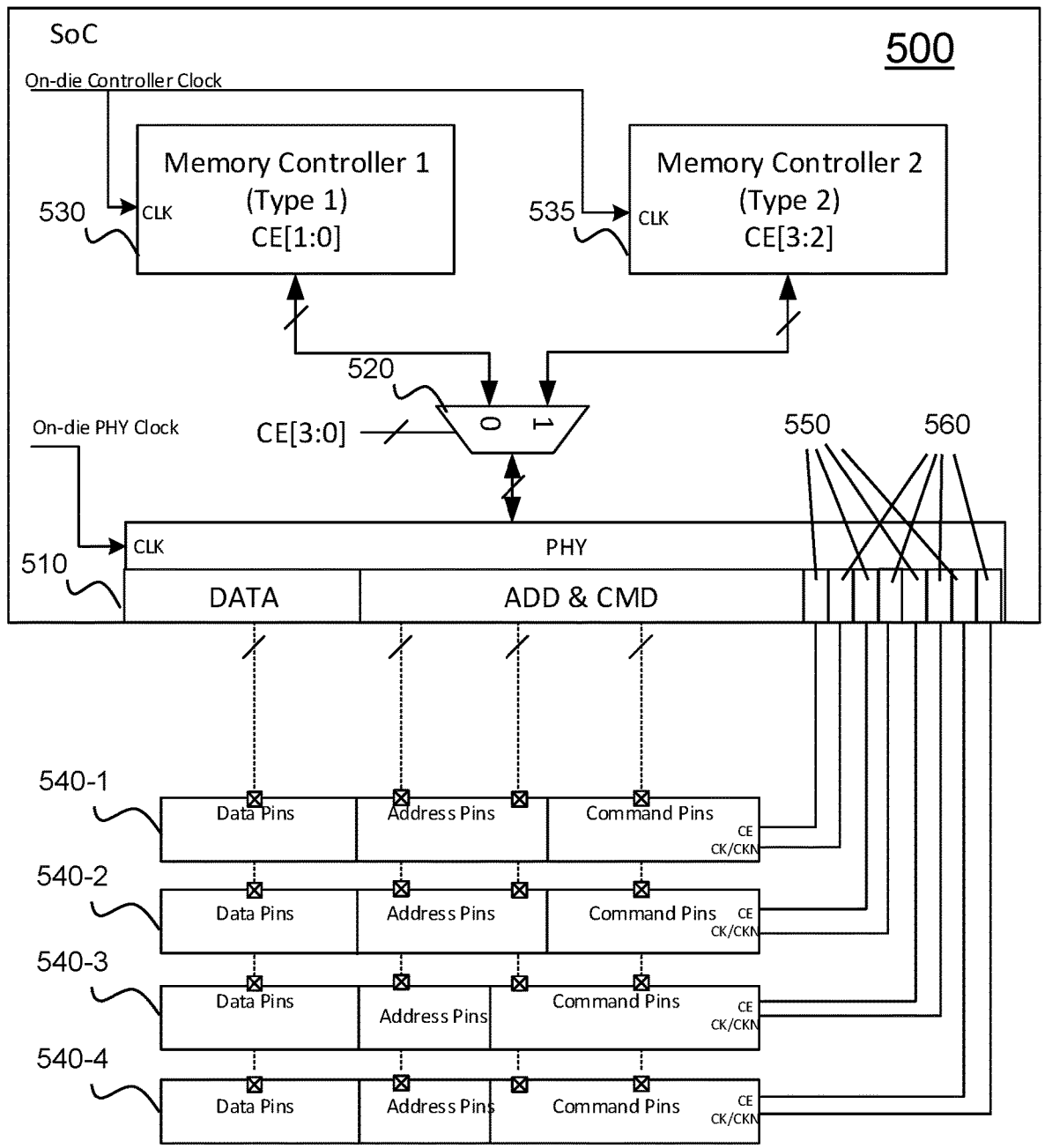
FIG. 5 is a schematic diagram of an exemplary 4-rank memory interface according to some embodiments of the present disclosure.

FIG. 5 is a schematic diagram of an exemplary 4-rank memory interface according to some embodiments of the present disclosure. As shown in FIG. 5, the memory interface 500 may include a physical block 510, a multiplexer (MUX) 520, a memory controller 1 530 and a memory controller 2 535. The memory interface 500 may be designed on a System-on-a-Chip (SOC) chip. In some embodiments, the memory interface 500 may communicate with memories 540 (e.g., memory 540-1, memory 540-2, memory 540-3, memory 540-4). The memory 540-1 and the memory 540-2 may be of a first type and both operate at first frequency f. The memory 540-1 and the memory 540-2 may be connected and controlled by the memory controller 1 530. The memory 540-3 and the memory 540-4 may be of a second type and both operates at a second frequency. The memory 540-3 and the memory 540-4 may be connected and controlled by the memory controller 2 535. The second frequency may be less than the first frequency f (e.g., ½ f). The memory 540-1, memory 540-2, memory 540-3, and memory 540-4 may be configured on rank 0, rank 1, rank 2 and rank 3, respectively. In some embodiments, the operating frequencies of the memory controller 1 530 and the memory controller 2 535 may be the same. The operating frequency of the PHY block 510 may be a multiple of the operating frequency of the memory controllers 530 and 535. Additionally, the operating frequency of the PHY block 510 may be a multiple of at least one of the first frequency or the second frequency. The PHY block 510 may include one or more DATA pins, one or more ADD & CMD pins, and four chip-enable (CE) pins 550 and four clock (CK or CLK) pins 560. Detailed descriptions regarding the definitions and functions of the pins may be found elsewhere in the present disclosure, e.g., FIG. 4 and the descriptions thereof. The four CE pins 550 may be connected to the four memories 540, respectively. The four CK pins 560 may also be connected to the four memories 540, respectively. The DATA pins, ADD pins & CMD pins may be connected to the MUX 520. An input signal may be transmitted from the DATA pins, ADD pins & CMD pins to the MUX 520 and to either the memory controller 1 530 or the memory controller 2 535 depending on the type of memory the host wants to access.

For example, when the first memory 540-1 at rank 0 is selected to be accessed by a host, the first CE pin that corresponds to the first memory 540-1 may be set to 1 (or high-voltage) while other three CE pins may be set to zero (or low-voltage). The first CK pins may be set to oscillate between 0 and 1 at an operating frequency of the first memory 540-1 (e.g., f) while other three CK pins may be set to zero (or low-voltage). An input signal may be transmitted from the DATA pins, ADD pins & CMD pins to the MUX 520, and the MUX may transmit the input signal to the memory controller 1 530. The memory controller 1 530 may then transmit the received signal to the first memory 540-1 at rank 0 (or more particularly, the corresponding pins of the first memory 540-1). A communication between the host and the first memory 540-1 at frequency f may be established.

In a case that another memory (e.g., the third memory 540-3 at rank 2) is selected to be accessed by a host, the third CE pin that corresponds to the third memory 540-3 may be set to 1 (or high-voltage) while other three CE pins may be set to zero (or low-voltage). The third CK pin may be set to oscillate between 0 and 1 at an operating frequency of the third memory 540-3 (e.g., ½ f) while other three CK pins may be set to zero (or low-voltage). An input signal may be transmitted from the DATA pins, ADD pins & CMD pins to the MUX 520, and the MUX may transmit the input signal to the memory controller 2 535. The memory controller 2 535 may then transmit the received signal to the third memory 540-3 at rank 2 (or more particularly, the corresponding pins of the third memory 540-3). A communication between the host and the third memory 540-3 at frequency ½ f may be established. An exemplary timing diagram of the communication between the host and the rank 0 and the rank 2 in different time periods may be found in FIG. 6 and the descriptions thereof.

Figure 6:
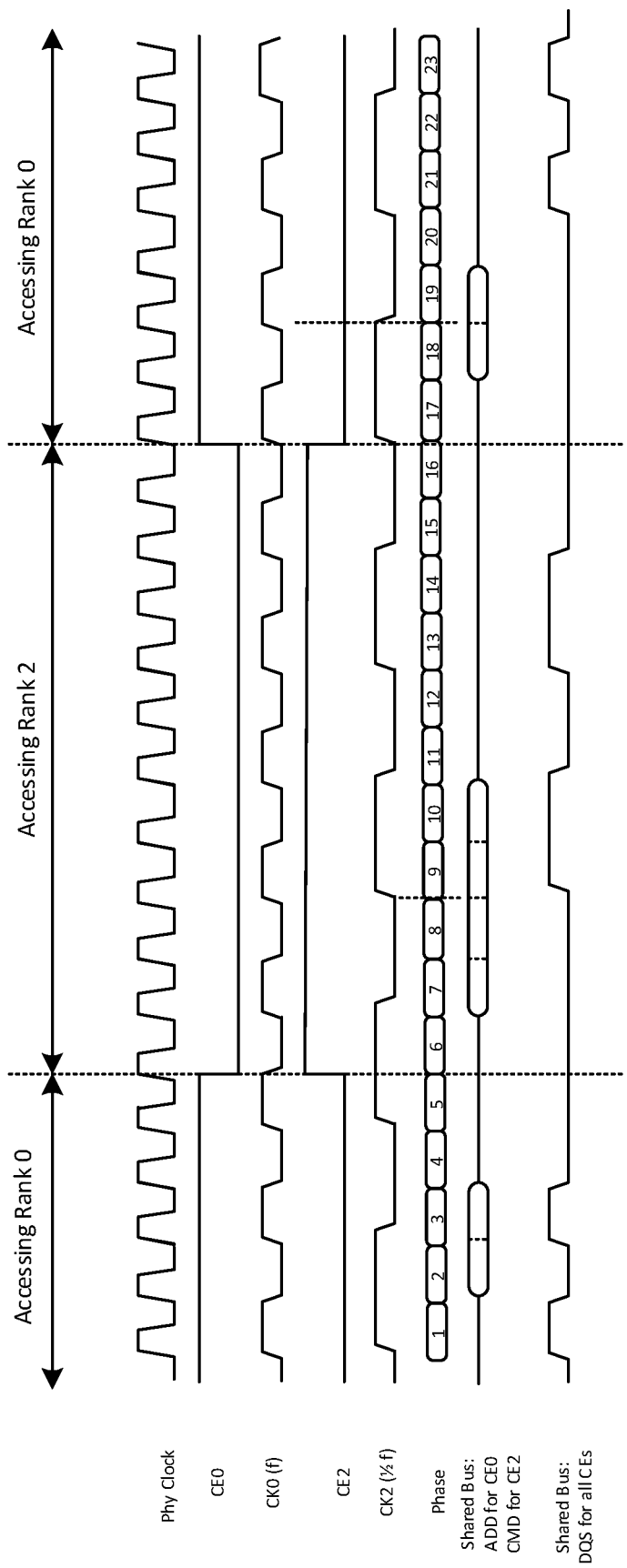
FIG. 6 is a timing diagram of an exemplary 4-rank memory interface according to some embodiments of the present disclosure.

FIG. 6 is a timing diagram of an exemplary 4-rank memory interface according to some embodiments of the present disclosure. In some embodiments, FIG. 6 may be a timing diagram corresponding to the 4-rank memory interface 500 in FIG. 5. Refer back to FIG. 5, the memory 540-1 and the memory 540-2 may be of a first type and both operate at first frequency f. The memory 540-1 and the memory 540-2 may be connected and controlled by the memory controller 1 530. The memory 540-3 and the memory 540-4 may be of a second type and both operates at a second frequency. The memory 540-3 and the memory 540-4 may be connected and controlled by the memory controller 2 535. The second frequency may be less than the first frequency f (e.g., ½ f). The memory 540-1, memory 540-2, memory 540-3, and memory 540-4 may be configured on rank 0, 1, 2 and 3, respectively.

The PHY block 510 may generate two pair of free running clocks, one at frequency f (on the first CK pin and the second CK pin) and the second pair at ½ f (on the third CK pin and the fourth CK pin). When CE0 (e.g., the first memory 540-1) is selected, memory controller 1 530 may be selected to transmit/receive data through the MUX 520. The memory controller 1530 may use the PHY block 510 to send out signal in phase 2 and 3 to form a command or address signal with a setup and hold window that is center-aligned with CK0's rising edge. Similarly, the DQS and DQ (e.g., strobe and data associated with the DATA pins) may be sent out with frequency f to the device on CE0 (e.g., the first memory 540-1). When CE2 (e.g., the third memory 540-3) is selected, memory controller 2 535 may be selected to pass through the MUX 520 and send out data. The memory controller 2 535 may send out data in phases 7, 8, 9 and 10 to form a command or address signal with a setup and hold window that is center-aligned with CK2's rising edge. Similarly, the DQS and DQ (e.g., strobe and data associated with the DATA pins) are sent out with frequency ½ f to the device on CE2 (e.g., the third memory 540-3). Under such configurations, each device (each of the memories 540) may receive its own CE and CK, shared command and address bus corresponding to its own CK's frequency and the addresses signals fitting its own addressing scheme.

Figure 7:
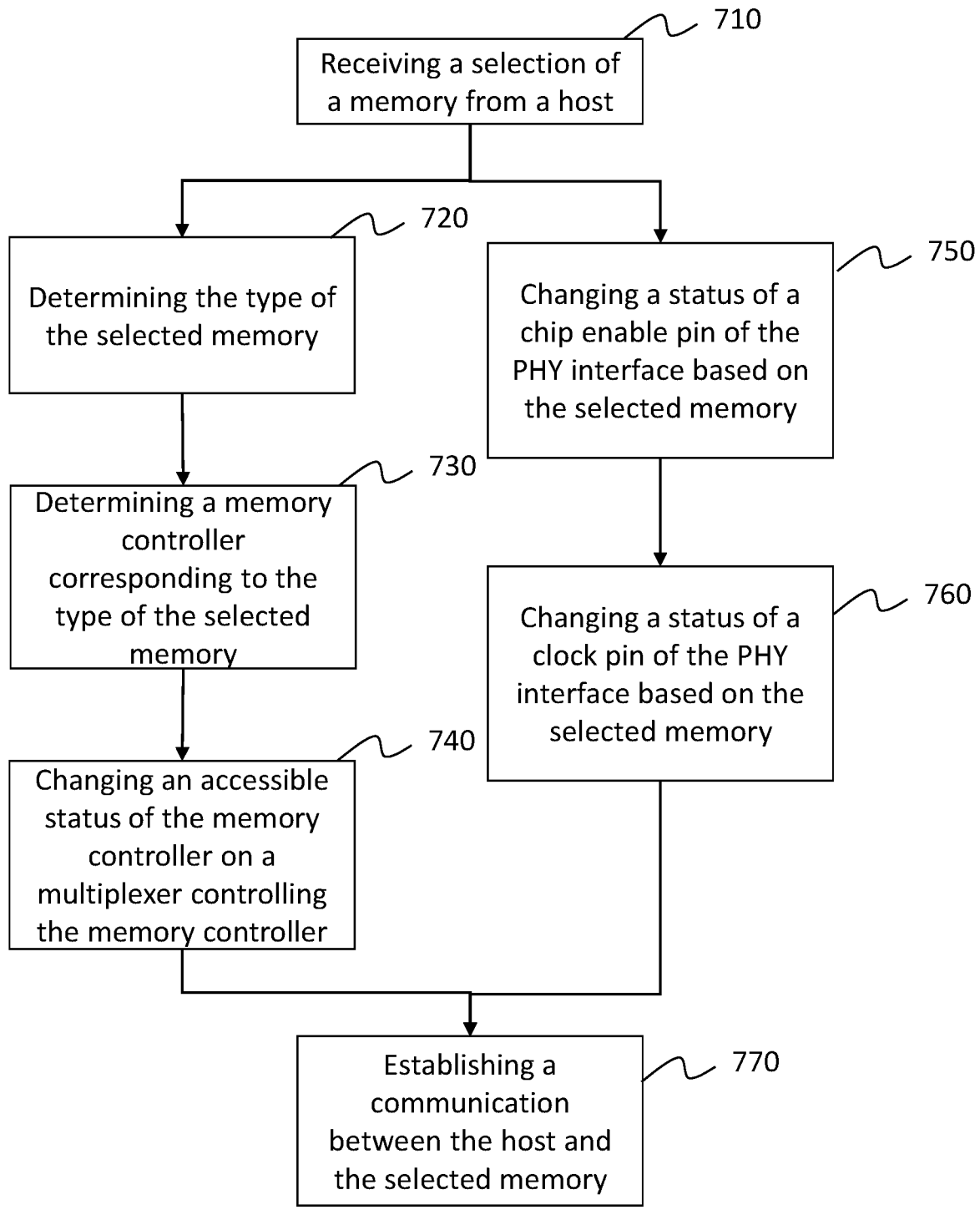
FIG. 7 is a flowchart illustrating an exemplary process for establishing a communication between a host and a memory according to some embodiments of the present disclosure.

FIG. 7 is a flowchart illustrating an exemplary process for establishing a communication between a host and a memory according to some embodiments of the present disclosure. In some embodiments, process 700 may be implemented on the processing system 100 as illustrated in FIG. 1. For example, the process 700 may be stored in a storage medium (e.g., the storage device 130, the external storage device 140, an internal memory of the processor 110, an internal memory of the memory interface 120, the control logic 150) as a form of instructions, and invoked and/or executed by the processor 110, the control logic 150 and/or the memory interface 120. The operations in the process 700 presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below may not be intended to be limiting.

In 710, the memory interface 120 may receive a selection of a memory from a host. The host may be the processor 110, the control logic 150, any other component in the processing system 100, or an external device outside the processing system 100. The selected memory may be one of a plurality of memories in the storage device 130 or the external storage device 140. For example, the selected memory may be one of the memories 330 in FIG. 3 (e.g., the memory 1-1, the memory 1-2 . . . , or the memory N-M$_N$).

In 720, the memory interface 120 may determine the type of the selected memory. In some embodiments, the type of the selected memory may be determined according to the operating frequency, manufacturing process, properties, pin configurations, and/or operating modes of the selected memory. Merely by way of example, the type of the selected memory may include but not limited to random-access memory (RAM), dynamic random-access memory (DRAM), static random-access memory (SRAM), non-volatile random-access memory (NVRAM), resistive random-access memory (ReRAM), ferroelectric random-access memory (FRAM), magnetoresistive random-access memory (MRAM), phase-change memory (PCM), conductive-bridging random-access memory (CBRAM), nano-RAM (NRAM), floating junction gate random-access memory (FJG RAM), read-only memory (ROM), mask ROM (MROM), programmable read-only memory (PROM), erasable programmable read-only memory (EPROM), electrically erasable programmable read-only memory (EEPROM), flash memory, race track memory, millipede memory, etc.

Alternatively or additionally, the type of the selected memory may be determined based on the operating frequency or clock frequency of the selected memory. In some embodiments, the plurality of memories in the storage device 130 or the external storage device 140 may be pre-classified into a plurality of types based on their operating frequencies or clock frequencies (as shown in FIG. 2). The memory interface 120 may determine the type of the selected memory directly based on the classification. For example, two DDR3-1333 SDRAM memories are pre-classified into the first type of memory 210 in FIG. 2 according to their operating frequencies (e.g., 666.67 megahertz (MHz)). When one of the two DDR3-1333 SDRAM memories is selected by the host in 710, the memory interface 120 may directly determine the type of the selected memory as the first type in 720. In some embodiments, the interface 120 may first determine the rank of the selected memory, and then determine the type of the selected memory corresponding to the rank.

In 730, the memory interface 120 may determine a memory controller corresponding to the type of the selected memory. In some embodiments, each type of memories may be connected to an independent memory controller. Refer to FIG. 3, different types of memories 330 may be controlled by independent memory controllers 320. For example, the first type of memories (e.g., memory 1-1, memory 1-2, . . . , memory 1-M$_1$) may be controlled by a memory controller 1. The memory controller 1 may control data transmission from or to the first type of memories. If one of the first type of memories is selected by the host, the memory interface 120 may determine the memory controller 1 as the memory controller corresponding to the type of the selected memory.

In 740, the memory interface 120 may change an accessible status of the memory controller on a multiplexer (MUX) controlling the memory controller. For example, the MUX controlling the memory controller may also be connected to one or more other memory controllers. The MUX may include an individual output pin for each of the memory controllers that the MUX is connected to. Each of the output pins may correspond to an accessible status of the corresponding controller. For example, if the accessible status of a memory controller is set to be 1, the output pin of the memory controller may be at a high voltage. A connection between the input pin of the MUX and the high-voltage output pin of the MUX corresponding to the memory controller may be established. The memory controller may be able to receive data from or transmit data to the host through the MUX. If the accessible status of a memory controller is set to be 0, the output pin of the memory controller may be at a low voltage. The input pin of the MUX may not be connected to the low-voltage output pin of the MUX corresponding to the memory controller.

In 750, the memory interface 120 may change a status of a chip-enable (CE) pin of a memory interface physical (PHY) block (e.g., the PHY block 410, the PHY block 510) based on the selected memory. For example, each memory may be connected to a chip-enable (CE) pin on the PHY block. When a particular memory is selected, the memory interface 120 may change the status of the CE pin corresponding to the selected memory (from zero) to one (e.g., from low-voltage to high-voltage). The high-voltage CE pin may provide an instruction and/or power(s) for the selected memory to work. In some embodiments, when changing the status of the CE pin corresponding to the selected memory from zero to one, the memory interface 120 may also change the status of the CE pin(s) corresponding to other unselected memories to zero.

In 760, the memory interface 120 may change a status of a Clock (CK) pin of a memory interface physical (PHY) block based on the selected memory. For example, each memory may be connected to a CLK pin on the PHY block. When a particular memory is selected, the memory interface 120 may change the status of the CLK pin corresponding to the selected memory to oscillate between zero and one (between low-voltage and high-voltage) at a certain oscillating frequency. The oscillating frequency may be the same as the clock frequency of the memory. The oscillating CLK pin may provide a memory clock signal (e.g., a square wave) for the selected memory. In some embodiments, the PHY interface may include an individual clock signal (known as a PHY clock signal). The PHY interface may generate the memory clock signal from the PHY clock signal by a multiplier, a divider, and/or a synthesizer.

In 770, the memory interface 120 may establish a communication between the host and the selected memory. For example, the power of the selected memory may be provided by the CE pin, and the clock signal of the selected memory may be provided by the CLK pin. The host may read data from or write data into the selected memory though the MUX and the memory controller.

It should be noted that the above description is merely provided for the purposes of illustration, and not intended to limit the scope of the present disclosure. For persons having ordinary skill in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

We claim:

1. A memory system, comprising:
   at least one first type of memory configured on at least one first rank and to operate at a first frequency;
   at least one second type of memory configured on at least one second rank and to operate at a second frequency;
   a physical block (PHY), configured to generate a first clock at the first frequency and a second clock at the second frequency;
   a first memory controller configured to control the at least one first type of memory; and
   a second memory controller configured to control the at least one second type of memory, wherein the first memory controller and the second memory controller operate at a third frequency.

2. The memory system of claim 1, further comprising:
   an address bus and a command bus, wherein at least one of the address bus or the command bus is shared between the at least one first type of memory and the at least one second type of memory.

3. The memory system of claim 1, wherein each of the at least one first type of memory and the at least one second type of memory is connected to a chip-enable (CE) pin, wherein
   when the CE pin is selected by a host, the memory connected to the CE pin is accessible to the host.

4. The memory system of claim 1, further comprising:
   a multiplexer (MUX) connected to the first memory controller and the second memory controller, and configured to switch the accessible status of the first type of memory and the second type of memory, wherein
      when one of the at least one first type of memory is selected by a host, the first memory controller is accessible to the host through the MUX; and
      when one of the at least one second type of memory is selected by the host, the second memory controller is accessible to the host through the MUX.

5. The memory system of claim 1, wherein the PHY operates at a fourth frequency, the fourth frequency being a multiple of the third frequency.

6. The memory system of claim 1, wherein the second frequency is a fraction of the first frequency.

7. The memory system of claim 1, wherein the fourth frequency is a multiple of at least one of the first frequency or the second frequency.

8. The memory system of claim 7, wherein the PHY is configured to divide, based on the fourth frequency, an interface signal of the memory system into a plurality of successive phases.

9. The memory system of claim 8, wherein the plurality of successive phases include at least one first phase and at least one second phase, wherein
one of the at least one first type of memory is accessible to a host in the at least one first phase at the first frequency; and
one of the at least one second type of memory is accessible to the host in the at least one second phase at the second frequency.

10. A method, comprising:
receiving a selection of a memory in a memory system from a host, the memory system including at least one first type of memory configured to operate at a first frequency, and at least one second type of memory configured to operate at a second frequency;
determining a type of the selected memory;
determining a memory controller corresponding to the type of the selected memory; and
establishing a communication between the host and the selected memory via the memory controller, wherein the memory controller operates at a third frequency.

11. The method of claim 10, wherein establishing a communication between the host and the selected memory via the memory controller includes:
establishing a communication between the memory controller corresponding to the type of the selected memory and the host based on a multiplexer (MUX), wherein the MUX is configured to switch the accessible status of the first type of memory and the second type of memory.

12. The method of claim 10, wherein the memory system further includes a physical block (PHY) configured to generate a first clock at the first frequency and a second clock at the second frequency.

13. The method of claim 12, wherein establishing a communication between the host and the selected memory via the memory controller includes:
changing a status of a chip-enable (CE) pin of the PHY, wherein the CE pin controls the accessibility to the selected memory.

14. The method of claim 12, wherein the PHY operates at a fourth frequency, wherein the fourth frequency is a multiple of the third frequency.

15. The method of claim 14, wherein the fourth frequency is a multiple of at least one of the first frequency or the second frequency.

16. The method of claim 15, wherein the PHY is configured to divide, based on the fourth frequency, an interface signal of the memory system into a plurality of successive phases.

17. The method of claim 16, wherein the plurality of successive phases include at least one first phase and at least one second phase, wherein
one of the at least one first type of memory is accessible to the host in the at least one first phase at the first frequency; and
one of the at least one second type of memory is accessible to the host in the at least one second phase at the second frequency.

18. The method of claim 10, wherein the second frequency is a fraction of the first frequency.

19. The method of claim 10, wherein the memory system includes a data bus, an address bus, and a command bus, wherein at least one of the data bus, the address bus, or the command bus is shared between the at least one first type of memory and the at least one second type of memory.

20. The memory system of claim 1, further comprising:
a data bus, wherein the data bus is shared between the at least one first type of memory and the at least one second type of memory.

* * * * *